United States Patent
Wang et al.

(10) Patent No.: US 8,017,955 B2
(45) Date of Patent: Sep. 13, 2011

(54) COMPOSITE LED MODULES

(75) Inventors: Lingli Wang, Eindhoven (NL); Koen Van Os, Eindhoven (NL); Johannes Petrus Maria Ansems, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 479 days.

(21) Appl. No.: 11/719,300

(22) PCT Filed: Nov. 15, 2005

(86) PCT No.: PCT/IB2005/053756
§ 371 (c)(1),
(2), (4) Date: May 15, 2007

(87) PCT Pub. No.: WO2006/054236
PCT Pub. Date: May 26, 2006

(65) Prior Publication Data
US 2009/0134409 A1    May 28, 2009

(30) Foreign Application Priority Data

Nov. 19, 2004  (EP) .................................... 04105910

(51) Int. Cl.
*H01L 29/20* (2006.01)
(52) U.S. Cl. .................... 257/89; 257/77; 257/E51.022; 438/25; 438/27; 438/29
(58) Field of Classification Search .................. 257/77, 257/88, 98; 438/25–35
See application file for complete search history.

(56) References Cited

U.S. PATENT DOCUMENTS

| | | | |
|---|---|---|---|
| 3,739,241 A | 6/1973 | Thillays | |
| 5,703,436 A * | 12/1997 | Forrest et al. | 313/506 |
| 5,731,067 A * | 3/1998 | Asai et al. | 428/210 |
| 6,586,874 B1 | 7/2003 | Komoto et al. | |
| 6,646,491 B2 * | 11/2003 | Worley et al. | 327/514 |
| 6,799,864 B2 * | 10/2004 | Bohler et al. | 362/236 |
| 6,960,872 B2 * | 11/2005 | Beeson et al. | 313/113 |
| 2003/0047742 A1 | 3/2003 | Hen | |
| 2003/0063462 A1 | 4/2003 | Shimizu et al. | |
| 2003/0132446 A1 | 7/2003 | Guenther et al. | |
| 2005/0093427 A1 * | 5/2005 | Wang et al. | 313/498 |

FOREIGN PATENT DOCUMENTS

| | | |
|---|---|---|
| EP | 1475835 A2 | 11/2004 |
| EP | 1641043 A1 | 3/2006 |
| JP | 02238679 A | 9/1990 |
| JP | 07015044 A | 1/1995 |
| JP | 2003077318 A | 3/2003 |

OTHER PUBLICATIONS

International Search Report Attached.

* cited by examiner

*Primary Examiner* — Thanh V Pham
*Assistant Examiner* — Mark A Laurenzi

(57) ABSTRACT

A composite multi-color light emitting diode device includes a first light emitting diode unit and a second light emitting diode unit that is arranged on top of the first light emitting diode unit for emitting two different wavelengths of electromagnetic radiation. A third light emitting diode unit may be arranged on top of the second light emitting diode unit, thereby providing a stack of three light emitting diode units. Alternatively, the third light emitting diode unit may be arranged on the first light emitting diode unit, thereby providing two light emitting diode units side-by-side on top of the first light emitting diode unit.

18 Claims, 7 Drawing Sheets

COMPOSITE LED MODULES

TECHNICAL FIELD OF THE INVENTION

The present invention relates to Light Emitting Diodes (LEDs).

TECHNOLOGICAL BACKGROUND

LED modules for general lighting (LED lamps, LED luminaries etc.) are conventionally made of a single LED, or a system of LEDs that are arranged in two dimensions.

An LED is characterized by its ability to generate monochrome light at a well-defined wavelength. This characteristic is useful for many applications, but complicates the generation of white light since it by definition is constituted by a mixture of wavelengths. One way to solve this problem is to add a wavelength converting material to an LED. For example, blue LEDs have been coated with a wavelength converting material that converts some of the blue light to yellow light. Thereby a white light can be provided as a mixture of converted yellow light and unconverted blue light. However, such white LEDs have limited brightness and are thus not satisfactory for use in applications requiring high light output levels.

An alternative solution is to mix light from two or more differently colored LEDs (i.e. from a multi LED). Such a multi LED arrangement also provides for dynamic adjustment of the color appearance, simply by adjusting the relative power of the respective LED components.

One such arrangement is disclosed in JP-07015044, which also proposes to put the differently colored LED units at different heights in order to improve the light output. However, the luminance of a single LED is limited. For general lighting purposes, a large number of LEDs have to be put together, which makes the illumination device bulky. This bulkiness is a general problem for compact applications, and typically also gives rise to problems in the color appearance of the device since it makes homogenous color mixing more complicated.

Hence there is a need for improved LEDs, that provide for high brightness, compactness, and homogenous color mixing.

SUMMARY OF THE INVENTION

Hence, according to one aspect of the present invention, a composite, multi-color light emitting diode is provided that comprises a first light emitting diode unit and a second light emitting diode unit. Each light emitting diode unit has an upper surface and a lower surface and is operative to emit light of a first and second wavelength, respectively, through its upper surface. Furthermore, the lower surface of the second light emitting diode unit is arranged on the upper surface of the first light emitting diode unit. In other words, the second diode unit is arranged on top of the first diode unit, and thus occupies a fraction of the light emitting upper surface of the first diode unit. Thereby two diode units are arranged at the space of one diode unit. This is advantageous since it provides for maximally efficient use of the available space and for better color mixing.

The light emitting diode units are essentially conventional LED units that are arranged on top of each other. As is well known in the art, LED units can have many different configurations. Each LED unit is provided with two electrodes for providing a driving voltage. The electrodes may be arranged on opposite sides of the unit, or they may be arranged side-by-side on the same side of the unit. Hence, the electrodes may be arranged on the upper side or the lower side of the unit. The electrodes are typically connected to their driver through interconnecting circuits and bond wires.

However, according to one embodiment, the upper surface of the first light emitting diode unit and the lower surface of the second light emitting diode unit each comprise an electrode that are electrically interconnected. Thereby the first and second units are connected in series without use of a separate interconnecting circuit or bond wire. In effect, the number of bond wires are limited resulting in easer manufacturing and an increased light-emitting surface (since the bond wire would otherwise occupy parts of the LED light path). Specific modification could be made in the plating layers of conventional light emitting diodes in order to enhance their electrical and thermal performance. One part of this additional plating layout could be used to attach the second diode unit on the first diode unit, and another, electrically interconnected part could receive a bond wire for simultaneous driving an upper electrode of the first diode and a lower electrode of the second diode.

In line with the present invention, it is furthermore possible to arrange a third LED unit in the composite LED device. According to one embodiment, the third LED unit is arranged on the upper surface of the first light emitting diode unit. Thereby two LED units are arranged side-by-side on the first LED unit. Alternatively, according to another embodiment, the third LED unit is arranged on the upper surface of the second light emitting diode unit. Thereby a stack of three LED units is provided.

Even though LED units have a relatively high degree of efficiency, it is impossible to avoid parts of the drive current from being converted to heat instead of light. This is particularly problematic in high-power LED modules, where heat generation is a major concern. Therefore, according to one embodiment, the LED further comprises a heat sink that is arranged in contact with the lower surface of the first light emitting diode unit, and that is operative to remove heat from said first light emitting diode unit. The heat sink can, for example, be formed out of metal which has a high thermal conductivity and a high heat absorption quality.

Depending on the LED configuration, the heat sink may furthermore contact not only the first LED unit. According to one embodiment, the heat sink is in contact with the lower surface of the second light emitting diode unit as well. Thereby the heat sink is operative to remove heat directly from the second LED unit as well.

A conventional LED unit can be perceived as a two-dimensional structure defined by the light-generating P/N-interface. Based on this perception, the present invention can be interpreted as a three-dimensional structure, having two or more two-dimensional structures arranged essentially parallel but separated in a third dimension. Each LED unit provides a light path that typically is perpendicular to the two-dimensional structure. The present invention is also characterized in that the light paths of LED units that are arranged on the first (bottom) LED unit occupy a portion of the light path otherwise provided by the first LED unit. One particular embodiment of the present invention can be interpreted as having a first light emitting diode with a first light emitting surface that carries a second light emitting diode with a second light emitting surface, where the second light emitting diode is arranged such that light emitted from the first surface totally encircle light emitted from the second surface. This embodiment is particularly advantageous from a light mixing perspective.

The present invention is advantageous compared to conventional LED arrangements in that it provides compact and powerful LED modules with a high degree of color mixing. For example, the present invention can provide compact and highly powerful white LED modules, by combining e.g. a blue LED unit and a yellow LED unit. Thereby the light emitting devices in accordance with the present invention can be advantageously used for general lighting purposes.

There are a number of conventional types of LED units. A first type is generally relatively thin and carries two electrode pads on the front, light emitting surface. The opposing, backside surface is typically designed to provide high thermal conductivity. In conventional LED arrangements, this backside surface typically faces a carrier substrate or a heat sink. In accordance with the present invention, this backside can, alternatively, face another LED unit. These LED units typically have a thickness that is at least two times smaller than its planair dimensions.

A second type of LED units is similar to the first type, but have both electrode pads arranged on the backside instead. This is advantageous from a light emittance perspective, since the light emitting surface of the unit is not blocked by bond wires etc.

A third type of LED unit is typically a bit thicker than the above types, and carries one electrode pad on each side. In other words, one electrode pad is arranged on the front, light emitting surface and another electride pad is arranged on the opposing backside surface.

Any type of LED units could be used to build a composite LED module in accordance with the present invention. The thin types of LED units are preferably modified to enhance their electrical and thermal performance. For example, additional metal plating can be added to the top surface in order to facilitate conventional attachment of another LED unit thereto. It is also possible to add plating structures for electrical interconnection of the attached LED unit (like bond wire pads).

However, it is also possible to build LED stacks using conventional LED units without any modifications on the top surface. For example, LED units can be attach using an intermediate conventional die attach material between the two LED units.

Once the LED stack is provided, a conventional wire bond process can be used for allocating the remaining electrical interconnects to the module. However, the order of the processing steps is not specific. For example, the wire bonds of the first LED unit can be arranged before attaching the second LED unit. In such case, use can be made of different types of solder material in order to prevent remelting of a earlier made interconnect while establishing the next interconnect, as is known from semiconductor packaging.

One conventional way of attaching an LED unit to another LED unit is to use a die attach material. The die attach material has to be applied between the two LED units and a thermal process has to be preformed to establish an interconnect. The die attach material could, for example, be a solder material, a silver filled epoxy or silver filled glass material.

In fact, attaching a LED unit on another LED unit is typically less complicated than it is to attach an LED unit to a conventional substrate. In general, when attaching an LED unit to a conventional substrate, there are substantial differences in the coefficient of thermal expansion (CTE) in the LED material compared to the substrate material. When driving the LED unit, heat is developed in the LED resulting in stress loads at the attaching surfaces. When attaching an LED unit on another LED unit, the respective materials generally have a more similar CTE. Thereby the temperature induced stress loads are typically lower in an LED/LED interface than in an LED/substrate interface. Consequently, it is possible to use thin, brittle, high thermal conductive die attach materials which is unsuitable for use in conventional interconnects due to CTE mismatch.

The strees loads can be further reduced by driving the respective LED units in a temperature controlled way. For example, the temperature of the first LED unit can be determined from its electrical drive current and the temperature of the second LED unit can be made to automatically follow the temperature of the first LED by controlling the electrical drive current of the second LED unit.

BRIEF DESCRIPTION OF THE DRAWINGS

Detailed descriptions of preferred embodiments will now be given with reference to the accompanying, exemplifying drawings, on which.

DETAILED DESCRIPTION OF EMBODIMENTS

Figure 1:
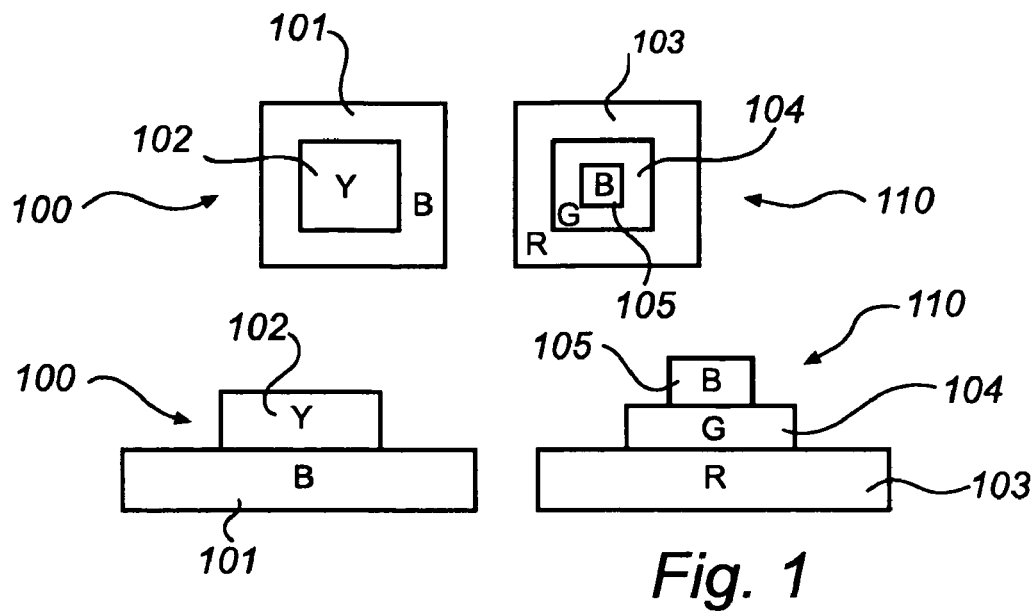
FIG. 1 illustrates top views and cross-sections of LED modules in accordance with the present invention having two and three LED units stacked on each other.

FIG. 1 illustrates two alternative composite LEDs, 100 being a two color blue 101 and yellow 102 composite LED and 110 being a three color red 103, green 104, and blue 105 composite LED.

Figure 2:
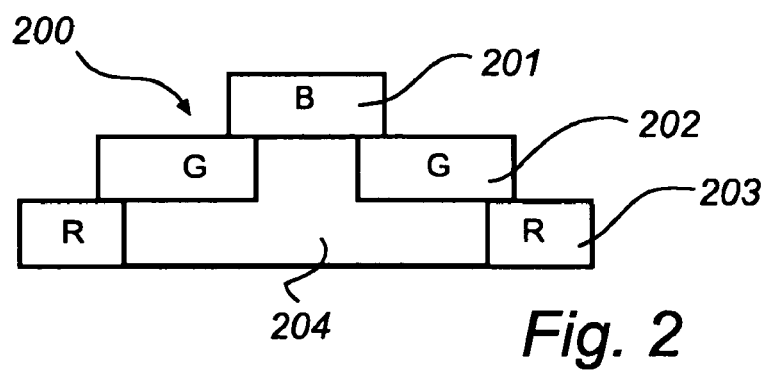
FIG. 2 illustrates a cross-section of an LED module in accordance with the present invention, having three LED units stacked on a heat sink.

In an alternative embodiment, as illustrated in FIG. 2, a composite LED 200 is provided with a heat sink 204 on which the LED units 201, 202, 203 are arranged. The heat sink 204 serves to remove heat from the LED units during operation.

Figure 3:
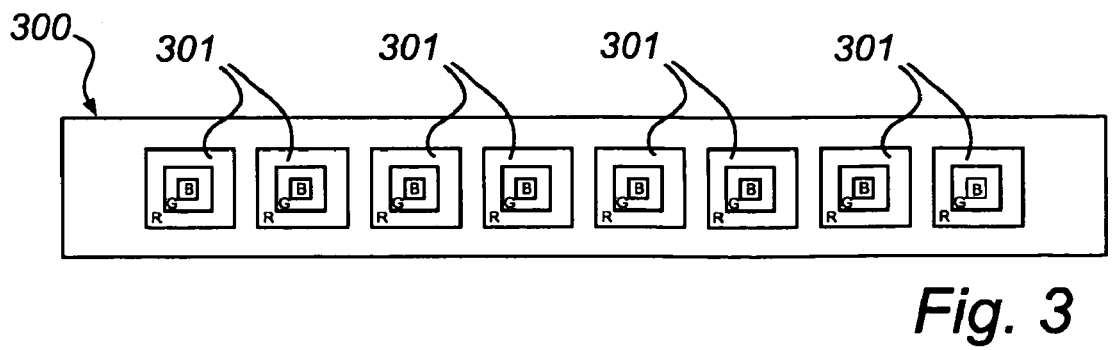
FIG. 3 illustrates eight LED modules arranged in a row, forming a light source for a line lamp.
Figure 4:
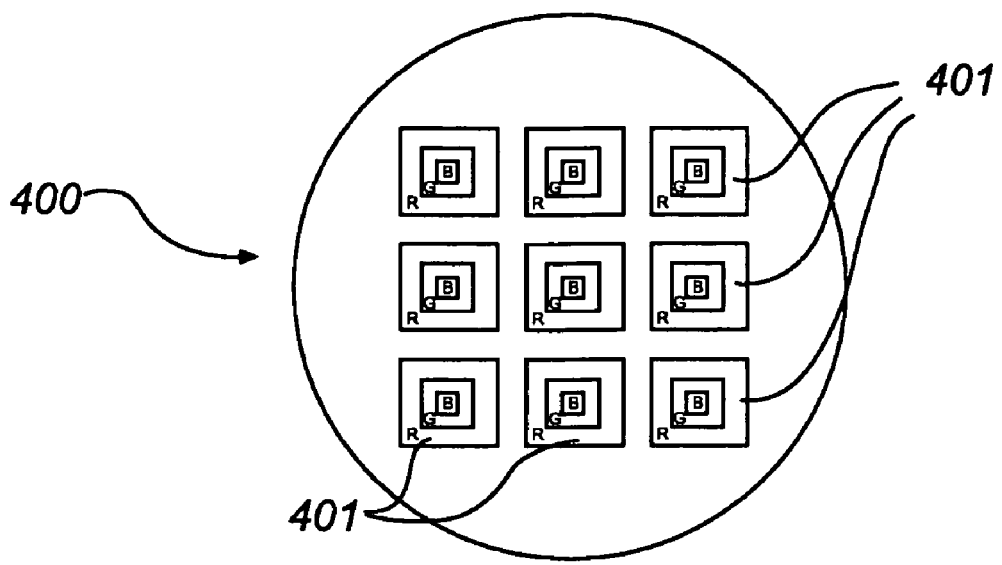
FIG. 4 illustrates nine LED modules arranged in a three-by-three array, forming a light source for a spot lamp.

The composite LED is advantageous for use in many applications. For example, as illustrated in FIG. 3, an 8-by-1 array of composite LEDs can be arranged in line lamp 300. An alternative configuration in the form of a spot lamp 400 is illustrated in FIG. 4, carrying a 3-by-3 array of composite LEDs 401.

Figure 5:
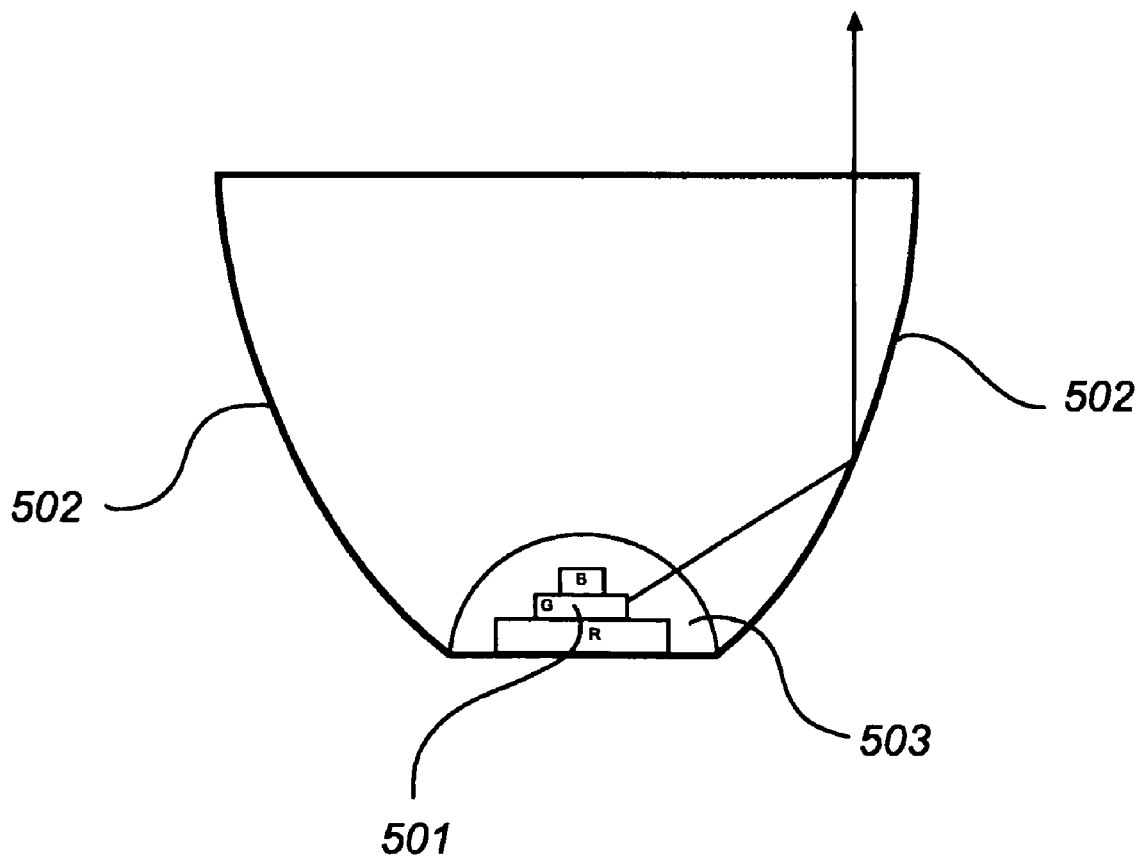
FIG. 5 illustrates an LED module having a reflector for reflecting, mixing, and focusing of the light emitted from the LED, having a dielectric encapsulation.
Figure 6:
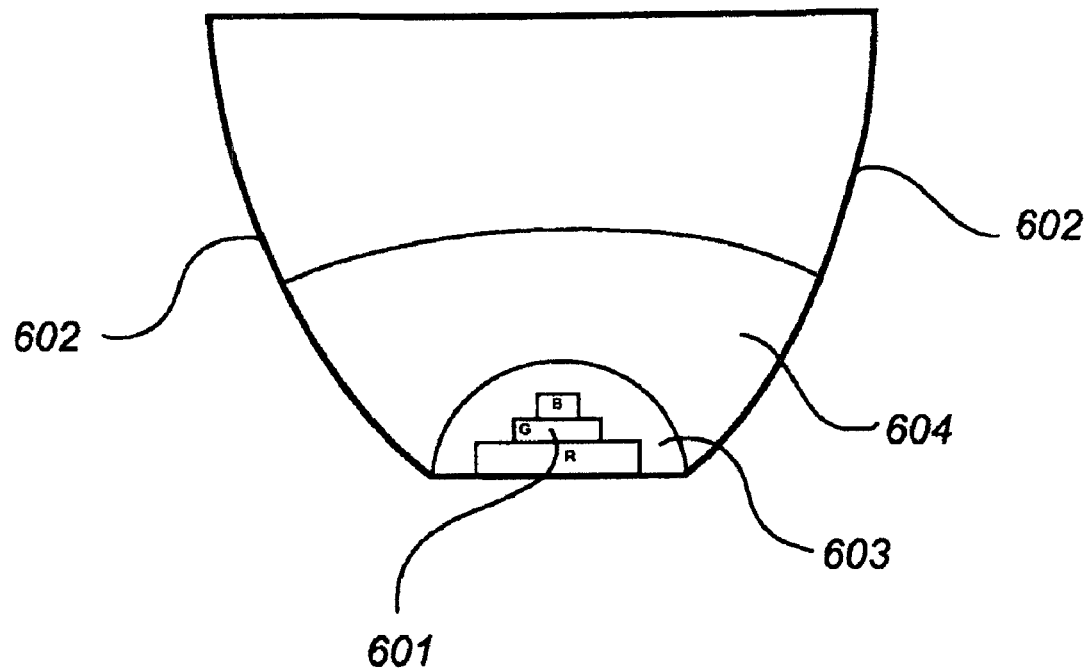
FIG. 6 illustrates an arrangement similar to FIG. 5, furthermore arranged with a collimator.

According to one embodiment, as illustrated in FIG. 5, a composite LED 501 can be arranged with a reflector 502. In such an arrangement, the composite LED may furthermore be encapsulated in an encapsulating material 503. The reflector can, for example, be formed out of aluminium and defines cavity in which light emitted from the composite LED is mixed and focused. According to one design, the cavity is open and thus communicates directly with the environment surrounding the light module. According to another design, as illustrated in FIG. 6, the cavity is instead filled with a clear dielectric forming a collimator 604 and having a collimating effect on the emitted light. Apart from the collimator 604, the composite LED illustrated in FIG. 6 is similar to the one illustrated in FIG. 5, and the respective part are indicated with corresponding reference numbers beginning with 6 instead of 5. The collimator 604 has a lens shape that depends on the desired collimating effect. In particular, the collimator may have a lens shaped outer surface (as illustrated by collimator 604), or it may have a flat outer surface (not shown).

Figure 7:
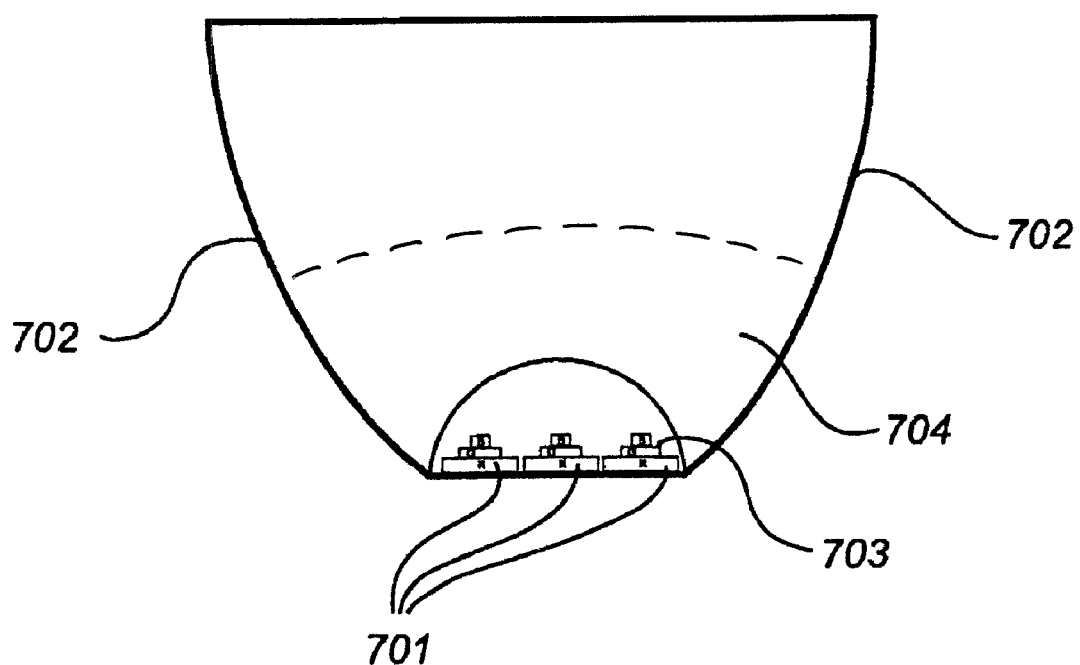
FIG. 7 illustrates a cross-section of a lighting module having an array of LED modules arranged in a reflector.

The reflector generally serves to focus and mix the light that is emitted from the composite LED. According to yet one embodiment, a number of composite LEDs 701 is arranged in a common reflector 702 behind a common layer of encapsulation 703. Similar to the arrangement illustrated in FIG. 6, the composite LED may optionally be fitted with a collimator 704 shown as dashed lines in FIG. 7.

Figure 8:
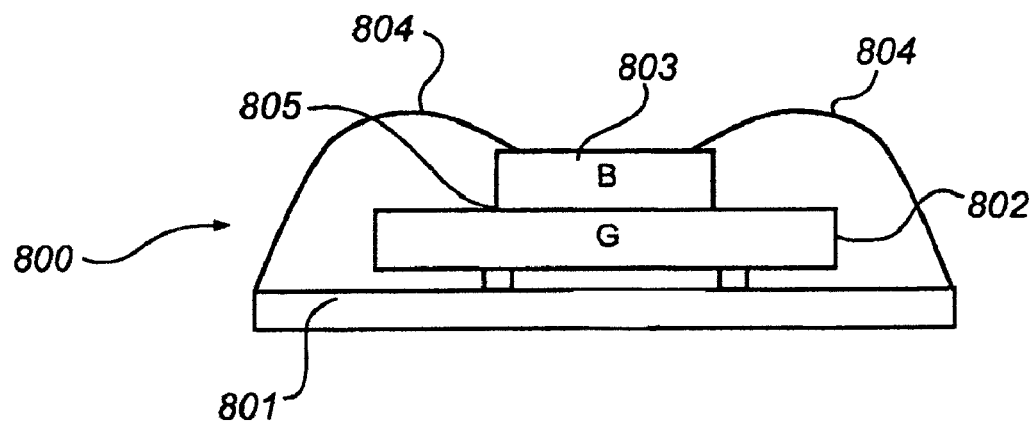
FIG. 8 illustrates a cross section of a composite light emitting diode unit, where a die-attach material is used for attaching the diode units.

FIG. 8 is a schematic cross-section of a two-color composite LED having a blue LED unit 803 arranged on top of a green LED unit 802. The device is arranged on a heat sink 801 from which it separated by thermally conductive spacers 806. The arrangement of the lower, green LED unit 802 on the heat sink 801 is similar to conventional single LED units. In line with conventional LED arrangements, bond wires 804 are attached to the LED units in order to provide drive voltages.

The upper, blue LED unit 803 it attached to the lower, green LED unit 802 by means of a conventional dye attach material 805, that serves to secure the two LED units. Attachment of the upper LED on the lower LED is straightforward. In particular, in contrast to the application of an LED unit on a heat sink or a substrate, the application of the upper LED unit does not need to consider any substantial differences in the coefficient of thermal expansion between the upper and lower LED units. Basically, the LED units all have the same general constitution, and thus also behaves essentially then same in response to temperature variations. This is typically not the case for LED units mounted on for example a heat sink.

Figure 9:
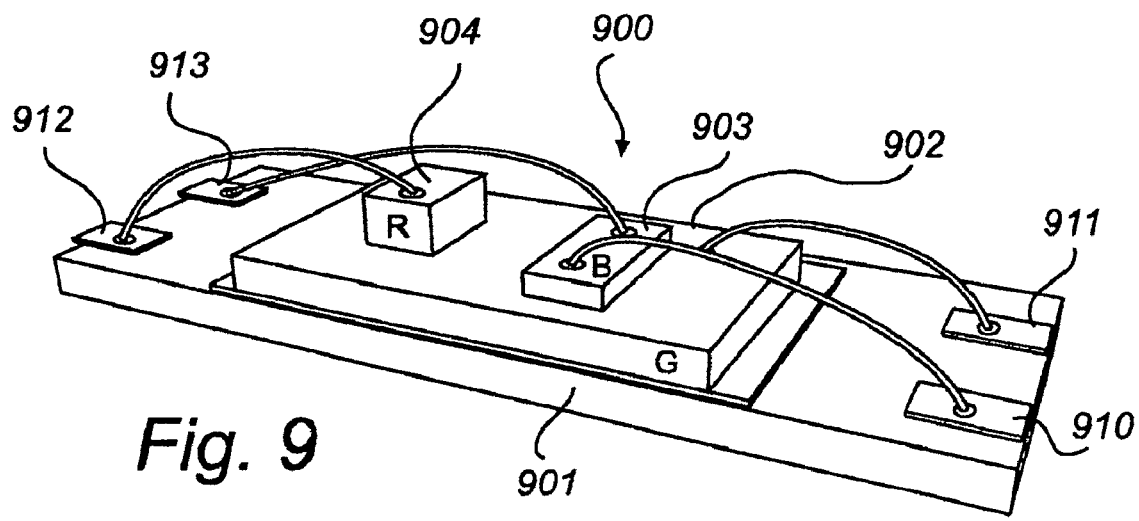
FIG. 9 is a perspective view illustrating light emitted from an LED module in accordance with the present invention.

FIG. 9 illustrates schematic perspective view of a three-color composite LED, having a green LED unit 902 arranged at the bottom on a heat sink 901. A blue LED unit 903 and a red LED unit 904 are arranged side-by-side on the green LED unit 902. The green and blue LED units both have their respective contact pads arranged on the upper side of the unit, whereas the red LED unit has one contact pad arranged on the upper side and one contact pad arranged on the lower side. The blue LED unit 903 is thus arranged electrically separated from the green LED unit 902, whereas the red LED unit 904 is arranged with its lower contact pad in direct contact with one of the upper contact pads of the green LED unit 902. Thereby it is possible to drive the green and red LED units in series, using only two bond wires 911 and 912. The blue LED unit is driven in conventional manner, using bond wires 910 and 913. In effect, the total number of bond wires is reduced from six to four, thereby reducing manufacturing complexity and increasing the effective light emitting area of the device.

Figure 10:
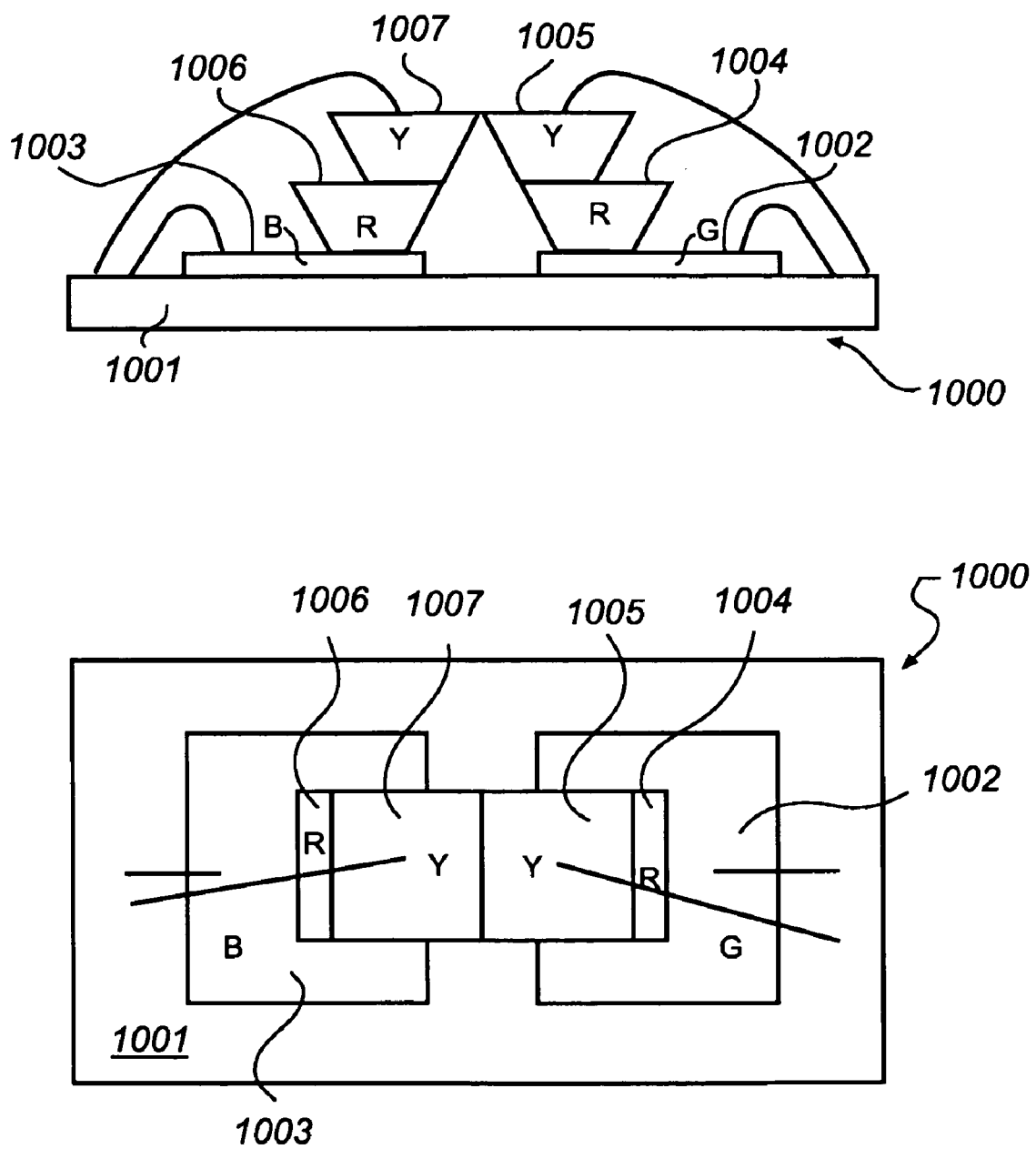
FIG. 10 illustrates a top view and a side view of a device having two stacks of three LED units arranged side by side.

FIG. 10 illustrates a top-view and a cross-section of yet one embodiment, having a blue and a green LED unit 1003, 1002 arranged side-by-side on a substrate 1001. Each of the blue and green LED units furthermore have red and a yellow LED unit 1004, 1005, 1006, 1007 stacked thereon, thus forming two stacks arranged side-by-side and having three LED units stacked on each other. According to this embodiment, the green and blue LED units each have their contact pads arrange on the upper side, whereas the red and yellow LED units have their contact pads arranged one the upper side and one on the lower side. Thereby each stack can be driven using only two bond wires each. This provides a particularly advantageous layout from a light efficiency perspective.

Figure 11:
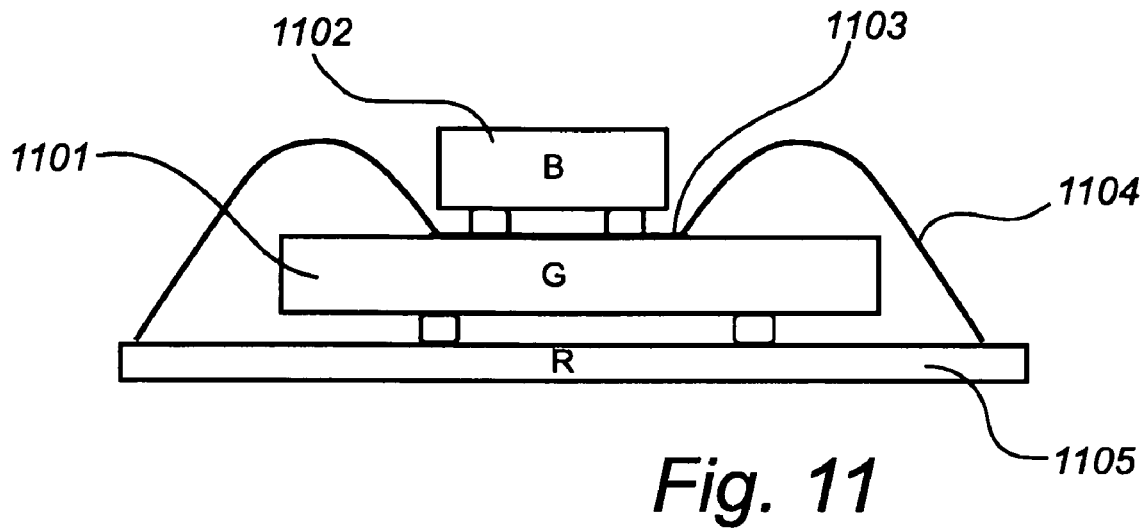
FIG. 11 illustrates a cross section of a second light emitting diode unit stacked on top of a first light emitting diode unit, using combined electrodes/solder pads arranged on the first light emitting diode unit.

Yet one embodiment is illustrated in FIG. 11, where a green LED 1101 is arranged on a heat sink 1105 and carries a blue LED unit 1102. The contact pads of the green LED unit are both provided on the topside, whereas the contact pads of the blue LED unit are both provided on the lower side, aligned with the contact pads of the green LED unit. Thereby the two LED units can use effectively the same contact points and thus only require two bond wires 1104.

Figure 12A:
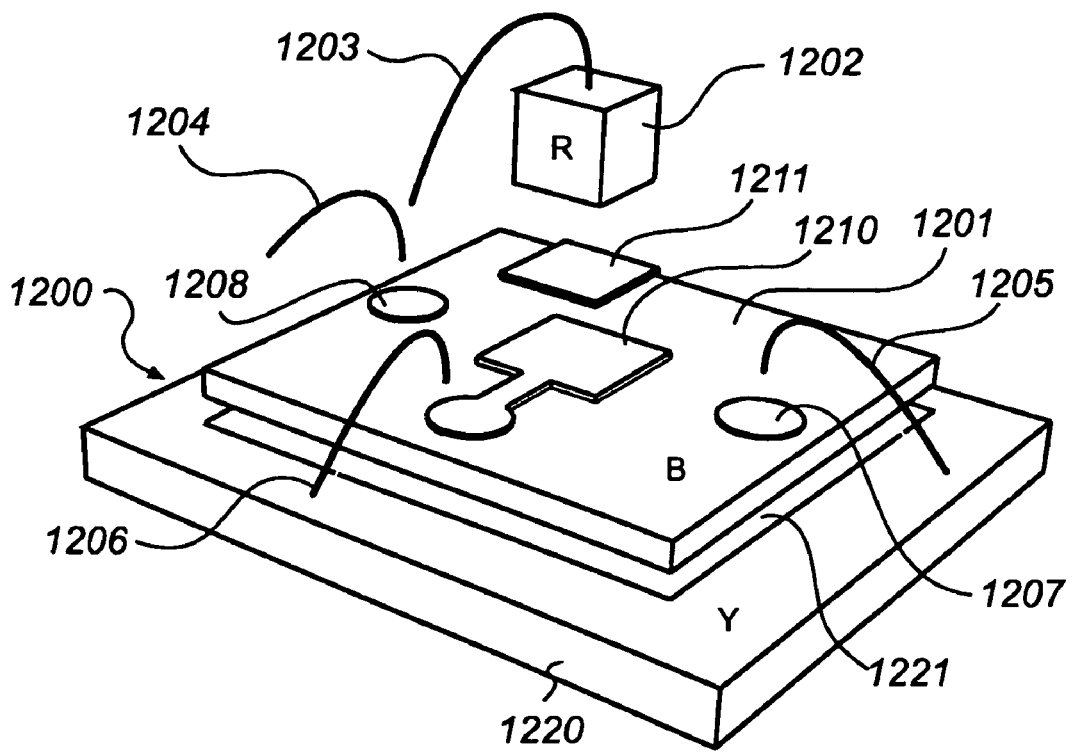
FIGS. 12a and 12b illustrate a perspective view and a cross-section of a plating structure that provides an enhanced mounting of the upper light emitting diode unit.
Figure 12B:
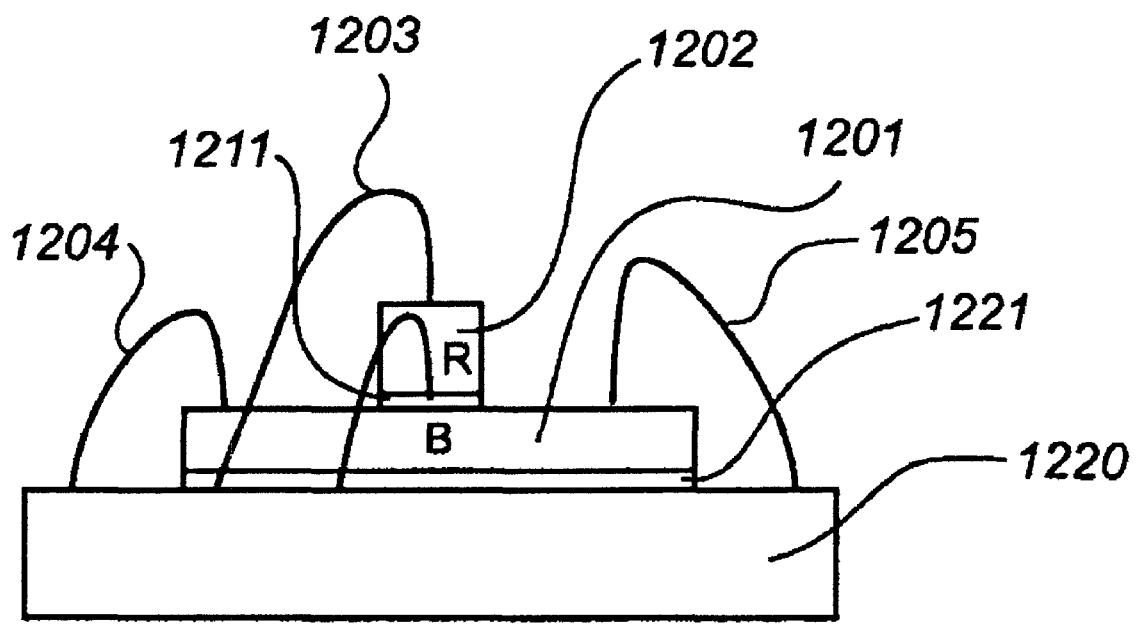

FIGS. 12a and 12b illustrates an exploded view of a composite LED 1200 having a blue LED unit 1201 and a red LED unit 1202. In particular, FIGS. 12a and 12b illustrate a perspective view and a cross-section view, respectively, of a plating structure that provides an enhanced mounting of the upper light emitting diode unit. As shown in FIGS. 12a and 12b, a heat sink 1221 is provided between the substrate 1220 and the blue LED unit 1201, similar to the embodiment shown in FIG. 9. A solder pad 1210 is formed on the blue LED unit 1201 for attaching the red LED unit 1202 through solder 1211. The solder pad 1210 is connected to a contact pad for attachment of a bond wire 1206 for driving the red LED unit 1202 together with another bond wire 1203 connected to the top surface of the red LED unit 1202. Bond wires 1204, 1205 are connected to contact pads 1208, 1207, respectively, formed on the top surface of the blue LED unit 1201 for driving the blue LED unit 1201.

In summary, the present invention provides a composite multi-color light emitting diode device 800 comprising a first light emitting diode unit 802 and a second light emitting diode unit 803 that is arranged on top of the first light emitting diode unit 802. Thereby, a composite light emitting diode device, capable of emitting two different wavelengths of electromagnetic radiation is provided. It is furthermore possible to arrange a third light emitting diode unit. The third light emitting diode unit can be arranged on top of the second light emitting diode unit, thereby providing a stack of three light emitting diode units, or it can be arranged on the first light emitting diode unit, thereby providing two light emitting diode units side-by-side on top of the first light emitting diode unit.

The invention claimed is:

1. A composite multi-color light emitting diode comprising a first light emitting diode unit and a second light emitting diode unit, each light emitting diode unit having an upper surface and a lower surface and being operative to emit light of a first wavelength and a second wavelength, respectively, through its upper surface; wherein the lower surface of the second light emitting diode unit is arranged on the upper surface of the first light emitting diode unit, the second light emitting diode unit occupying a fraction of the upper surface of the first light emitting diode unit leaving exposed a remainder of the of the upper surface of the first light emitting diode unit, wherein light of the second wavelength is emitted through the upper surface of the second light emitting diode, wherein light of the first wavelength is emitted through the remainder, wherein said upper surface of said first light emitting diode unit and said lower surface of said second light emitting diode unit comprise electrically interconnected electrodes that are operative to provide a driving current across the respective light emitting diode unit, and wherein said first light emitting diode unit is electrically connected in series with said second light emitting diode unit for being simultaneously driven using only two bond wires, wherein the electrically interconnected electrodes comprise an upper electrode on the upper surface of the first light emitting diode unit and a lower electrode on the lower surface of the second light emitting diode unit, and wherein the upper electrode is aligned with the lower electrode to form a single contact point for receiving one the of two bond wires.

2. The composite multi-color light emitting diode according to claim 1, wherein an upper electrode, said upper surface of said first light emitting diode unit and a lower electrode of said lower surface of said second light emitting diode unit are electrically interconnected for being simultaneously driven by a single bond wire.

3. The composite multi-color light emitting diode according to claim 1, further comprising a third light emitting diode unit having an upper surface and a lower surface and being operative to emit light of a third wavelength through its upper surface.

4. The composite multi-color light emitting diode according to claim 3, wherein the lower surface of said third light emitting diode unit is arranged on the upper surface of said first light emitting diode unit.

5. The composite multi-color light emitting diode according to claim 3, wherein the lower surface of said third light emitting diode unit is arranged on the upper surface of said second light emitting diode unit.

6. The composite multi-color light emitting diode according to claim 1, further comprising a heat sink that is arranged in contact with the lower surface of said first light emitting diode unit, and that is operative to remove heat from said first light emitting diode unit.

7. The composite multi-color light emitting diode according to claim 6, wherein said heat sink furthermore is in contact with the lower surface of said second light emitting diode unit and thus is operative to remove heat directly from said second light emitting diode.

8. The composite multi-color light emitting diode according to claim 1, further comprising a reflector that is arranged to reflect light from said light emitting diode units.

9. The composite multi-color light emitting diode according to claim 1, wherein said first light emitting diode unit comprises a solder pad on which said second light emitting diode unit is mounted.

10. The composite multi-color light emitting diode of claim 1, wherein a top contact pad on the upper surface of the first light emitting diode is connected to a bottom contact pad on the lower surface of the second light emitting diode unit, and wherein the composite multi-color light emitting diode is driven by two bond wires including a first bond wire connected to a lower contact pad on the lower surface of the first light emitting diode and a second bond wire connected to an upper contact pad on the upper surface of the second light emitting diode.

11. The composite multi-color light emitting diode of claim 1, further comprising a third light emitting diode located over the first light emitting diode adjacent to the second light emitting diode, wherein the upper surface of the first light emitting diode includes a first contact pad and the upper surface of the second light emitting diode includes a second contact pad, and wherein an upper surface of the third light emitting diode includes a third contact pad and the lower surface of the third light emitting diode includes a fourth contact pad which directly contacts the first contact pad for driving the first light emitting diode and the third light emitting diode in series through the first contact pad and the fourth contact pad.

12. The composite multi-color light emitting diode of claim 1, further comprising a heat sink having a top surface and a side surface, wherein the first light emitting diode contacts the side surface, and the second light emitting diode contacts the top surface.

13. The composite multi-color light emitting diode of claim 1, further comprising:
a third light emitting diode located over the second light emitting diode; and
a heat sink having a staircase shape having a first step with a first side surface and first top surface and a second step with a second side surface and second top surface;
the first light emitting diode contacting the side surface of the first step, the second light emitting diode contacting the top surface of the first step and the side surface of the second step, and the third light emitting diode contacting the top surface of the second step.

14. The composite multi-color light emitting diode of claim 1, further comprising a reflector surrounding the first light emitting diode and the second light emitting diode, wherein the reflector is partially filled with a clear dielectric material forming a collimator for collimating the light emitted from the first light emitting diode and the second light emitting diode.

15. The composite multi-color light emitting diode of claim 14, wherein the collimator has an outer surface opposite the first light emitting diode and the second light emitting diode, the outer surface being flat.

16. The composite multi-color light emitting diode of claim 14, wherein the collimator has an outer surface opposite the first light emitting diode and the second light emitting diode, the outer surface being curved.

17. The composite multi-color light emitting diode of claim 1, wherein the remainder is devoid of light obstructions so that the light of the first wavelength is emitted through all the remainder to totally encircle the light of the second wavelength.

18. A composite multi-color light emitting diode comprising a first light emitting diode unit and a second light emitting diode unit, each light emitting diode unit having an upper surface and a lower surface and being operative to emit light of a first wavelength and a second wavelength, respectively, through its upper surface; wherein the lower surface of the second light emitting diode unit is arranged on the upper surface of the first light emitting diode unit, the second light emitting diode unit occupying a fraction of the upper surface of the first light emitting diode unit leaving exposed a remainder of the of the upper surface of the first light emitting diode unit, wherein light of the second wavelength is emitted through the upper surface of the second light emitting diode, wherein light of the first wavelength is emitted through the remainder, wherein said upper surface of said first light emitting diode unit and said lower surface of said second light emitting diode unit comprise electrically interconnected electrodes that are operative to provide a driving current across the respective light emitting diode unit, and wherein said first light emitting diode unit is electrically connected in series with said second light emitting diode unit for being simultaneously driven using only two bond wires, further comprising a heat sink having a staircase shape so that a side surface of the first light emitting diode is in contact with the heat sink, and the lower surface and a side surface of the second light emitting diode is in contact with the heat sink.

* * * * *